(12) United States Patent
Yoda et al.

(10) Patent No.: US 9,608,152 B2
(45) Date of Patent: *Mar. 28, 2017

(54) SOLAR CELL ENCAPSULANT SHEET

(71) Applicant: Sumitomo Chemical Company, Limited, Tokyo (JP)

(72) Inventors: Hiroaki Yoda, Chiba (JP); Noboru Kondo, Chiba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 14/293,367

(22) Filed: Jun. 2, 2014

(65) Prior Publication Data

US 2014/0360579 A1  Dec. 11, 2014

(30) Foreign Application Priority Data

Jun. 6, 2013 (JP) ................ 2013-119543
Dec. 20, 2013 (JP) ................ 2013-263417
Apr. 24, 2014 (JP) ................ 2014-089867

(51) Int. Cl.
| | |
|---|---|
| *H01L 31/048* | (2014.01) |
| *C08J 5/18* | (2006.01) |
| *C08K 3/34* | (2006.01) |
| *C08K 3/36* | (2006.01) |
| *C08K 5/5425* | (2006.01) |

(52) U.S. Cl.
CPC ............ *H01L 31/0481* (2013.01); *C08J 5/18* (2013.01); *C08K 3/34* (2013.01); *C08K 3/36* (2013.01); *C08K 5/5425* (2013.01); *C08J 2323/04* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2008/0078445 A1 | 4/2008 | Patel et al. | |
| 2008/0264481 A1* | 10/2008 | Hayes | .............. B32B 17/10036 |
| | | | 136/256 |
| 2009/0255571 A1* | 10/2009 | Xia | ........................ B29C 70/70 |
| | | | 136/251 |
| 2012/0000514 A1 | 1/2012 | Amamiya et al. | |
| 2013/0118583 A1 | 5/2013 | Patel et al. | |
| 2013/0167911 A1 | 7/2013 | Ikenaga et al. | |
| 2015/0129018 A1* | 5/2015 | Declerck | ........... B32B 17/10018 |
| | | | 136/251 |

FOREIGN PATENT DOCUMENTS

| | | |
|---|---|---|
| CN | 102352193 A | 2/2012 |
| JP | 2000-183385 A | 6/2000 |
| WO | 2014021436 A1 | 2/2014 |

OTHER PUBLICATIONS

Office Action issued Oct. 31, 2016 in CN Application No. 201410242009.3.

* cited by examiner

*Primary Examiner* — Catherine S Branch
(74) *Attorney, Agent, or Firm* — Panitch Schwarze Belisario & Nadel LLP

(57) ABSTRACT

The present invention relates to a solar cell encapsulant sheet comprising at least one ethylene-based resin selected from the group consisting of an ethylene-α-olefin copolymer, an ethylene homopolymer and an ethylene-unsaturated ester copolymer, 0.001 parts by mass to 5 parts by mass of at least one compound selected from the group consisting of silicon dioxide and zeolite, and 0.001 parts by mass to 5 parts by mass of a silane coupling agent, relative to 100 parts by mass of the ethylene-based resin respectively.

6 Claims, No Drawings

SOLAR CELL ENCAPSULANT SHEET

BACKGROUND OF THE INVENTION

Field of the Invention

The present invention relates to a solar cell encapsulant sheet.

Description of the Related Art

Solar cell modules are attracting much attention as being suitable for utilization of renewable energy and they continue to grow in popularity in recent years.

Such solar cell modules generally contain a protective material for a light receiving surface made of glass, a solar cell element (photovoltaic element), an encapsulant sheet, and a back sheet. Sheets made of an ethylene-vinyl acetate copolymer or an ethylene-α-olefin copolymer are used as the encapsulant sheet (Patent Documents 1 to 4).

PRIOR ART DOCUMENTS

Patent Documents

Patent Document 1: JP-A-2000-183385
Patent Document 2: JP-A-2010-258439
Patent Document 3: WO 2012/046456 A
Patent Document 4: JP-T-2010-504647

SUMMARY OF THE INVENTION

However, the encapsulant sheets disclosed in these Patent Documents are demanded to be improved in electrical insulating properties. Recently, light receiving surface protective materials made of glass have tended to be replaced by those made of resin for weight reduction, and there is a further need for encapsulant sheets excellent in water vapor permeability because light receiving surface protective materials made of resin are inferior to those made of glass in water vapor barrier properties.

The present invention has been devised in view of the above-mentioned problems and the object thereof is to provide a solar cell encapsulant sheet excellent in electrical insulating properties and water vapor barrier properties.

The present inventors researched earnestly in order to solve the above-mentioned problems and have accomplished the present invention.

The present invention relates to a solar cell encapsulant sheet comprising at least one ethylene-based resin selected from the group consisting of an ethylene-α-olefin copolymer, an ethylene homopolymer and an ethylene-unsaturated ester copolymer, 0.001 parts by mass to 5 parts by mass of at least one compound selected from the group consisting of silicon dioxide and zeolite, and 0.001 parts by mass to 5 parts by mass or a silane coupling agent, relative to 100 parts by mass of the ethylene-based resin respectively.

According to the present invention, a solar cell encapsulant sheet excellent in electrical insulating properties and water vapor barrier properties.

DETAILED DESCRIPTION OF THE PREFERRED EMBODIMENTS

[Ethylene-Based Resin]

The ethylene-based resin contained in the solar cell encapsulant sheet according to the present invention is at least one ethylene-based resin selected from the group consisting of an ethylene-α-olefin copolymer, an ethylene homopolymer, and ethylene-unsaturated ester copolymer. Preferably, the ethylene-based resin is an ethylene-unsaturated ester copolymer.

[Ethylene-α-olefin Copolymer]

The ethylene-α-olefin copolymer according to the present invention is ethylene-α-olefin copolymer comprising monomer units derived from ethylene and monomer units derived from an α-olefin having 3 to 20 carbon atoms. Examples of the α-olefins include propylene, 1-butene, 1-pentene, 1-hexene, 1-heptene, 1-octene, 1-nonene, 1-decene, 1-dodecene, 4-methyl-1-pentene, and 4-methyl-1-hexene; these may be used singly or two or more of them may be used in combination. Preferred as the α-olefin are 1-butene, 1-hexene, 4-methyl-1-pentene and 1-octene.

The content of the monomer units derived from ethylene in the ethylene-α-olefin copolymer of the present invention is usually 50% by mass to 99.5% by mass relative to the overall mass (100% by mass) of the ethylene-α-olefin copolymer. The content of the monomer units derived from the α-olefin is usually 0.5% by mass to 50% by mass relative to the overall mass (100% by mass) of the ethylene-α-olefin copolymer.

Examples of the ethylene-α-olefin copolymer according to the present invention include an ethylene-1-butene copolymer, an ethylene-1-hexene copolymer, an ethylene-4-methyl-1-pentene copolymer, an ethylene-1-octene copolymer, an ethylene-1-butene-1-hexene copolymer, an ethylene-1-butene-4-methyl-1-pentene copolymer, an ethylene-1-butene-1-octene copolymer, and an ethylene-1-hexene-1-octene copolymer; an ethylene-1-hexene copolymer, an ethylene-4-methyl-1-pentene copolymer, an ethylene-1-butene-1-hexene copolymer, an ethylene-1-butene-1-octene copolymer, and an ethylene-1-hexene-1-octene copolymer are preferred.

The density of the ethylene-α-olefin copolymer according to the present invention is usually 860 kg/m$^3$ to 950 kg/m$^3$. The density is measured in accordance with a method defined in Method A provided in JIS K7112-1980 after performing an annealing disclosed in JIS K6760-1995. The density of an ethylene-α-olefin copolymer can be changed by the content of the monomer units derived from ethylene in the ethylene-α-olefin copolymer.

The melt flow rate (hereinafter sometimes described as "MFR") of the ethylene-α-olefin copolymer according to the present invention is usually 0.01 g/10 minutes to 100 g/10 minutes. The lower limit of the MFR is preferably 0.1 g/10 minutes from the viewpoint of reducing extrusion load sheet processing. The upper limit of the MFR is preferably 50 g/10 minutes, more preferably 30 g/10 minutes from the viewpoint of increasing the mechanical strength of an encapsulant sheet. The MFR is a value measured by Method A under conditions of a temperature of 190° C. and a load of 21.18 N in the method defined in JIS K7210-1995. The MFR of the ethylene-α-olefin copolymer can be changed, for example, by a hydrogen concentration or a polymerization temperature in polymerization to form the ethylene-α-olefin copolymer; as a hydrogen concentration of a polymerization temperature is raised, the MFR of the ethylene-α-olefin increases.

[Ethylene Homoploymer]

The ethylene homopolymer according to the present invention is preferably an ethylene homopolymer obtained by polymerization ethylene by a high pressure process. For example, it is an ethylene homopolymer produced by polymerization ethylene in the presence of a radical generator under conditions of a polymerization pressure of 140

MPa to 300 MPa and a polymerization temperature of 200° C. to 300° C. by using a vessel type reactor or a tube type reactor.

The density of the ethylene homopolymer according to the present invention is usually 920 kg/m³ to 935 kg/m³. The lower limit of the density is preferably 925 kg/m³, more preferably 928 kg/m³. The density is measured in accordance with the method defined in Method A of JIS K7112-1980 after performing the annealing disclosed in JIS K6760-1995.

[Ethylene-Unsaturated Ester Copolymer]

The ethylene-unsaturated ester copolymer according to the present invention comprises monomer units derived from ethylene and monomer units derived from an unsaturated ester, wherein the content of the monomer units derived from the unsaturated ester is 20% by mass to 35% by mass where the sum total of the monomer units derived from ethylene and the monomer units derived from the unsaturated ester is taken as 100% by mass.

Examples of the unsaturated ester include a carboxylic acid vinyl ester and an unsaturated carboxylic acid alkyl ester. Examples of the carboxylic acid vinyl ester include vinyl acetate and vinyl propionate. Examples of the unsaturated carboxylic acid alkyl ester include methyl acrylate, ethyl acrylate, butyl acrylate, methyl methacrylate, ethyl methacrylate and glycidyl methacrylate.

Examples of the ethylene-unsaturated ester copolymer according to the present invention include an ethylene-vinyl acetate copolymer, an ethylene-vinyl propionate copolymer, an ethylene-methyl acrylate copolymer, an ethylene-ethyl acrylate copolymer, an ethylene-butyl acrylate copolymer, an ethylene-methyl methacrylate copolymer, an ethylene-ethyl methacrylate copolymer, an ethylene-glycidyl methacrylate copolymer and an ethylene-vinyl acetate-methyl methacrylate copolymer.

The content of the monomer units derived from the unsaturated ester contained in the ethylene-unsaturated ester copolymer is preferably 23% by mass to 33% by mass, more preferably 25% by mass to 32% by mass from the viewpoint of enhancing processability and transparency. These may be used singly or two or more of them may be used in combination. When the ethylene-unsaturated ester copolymer contains monomer units derived from two or more unsaturated esters, the sum total of the amounts of the monomer units derived from all the unsaturated esters contained in the ethylene-unsaturated ester copolymer is defined as the amount of the monomer units derived from the unsaturated esters.

Preferably, the ethylene-unsaturated ester copolymer is at least one copolymer selected from the group consisting of an ethylene-vinyl acetate copolymer, an ethylene-methyl acrylate copolymer, an ethylene-methyl methacrylate copolymer and an ethylene-vinyl acetate-methyl methacrylate copolymer.

The melt flow rate (MFR) of the ethylene-unsaturated ester copolymer is preferably 4 g/10 minutes to 50 g/10 minutes from the viewpoint of enhancing processability. The upper limit of the MFR is more preferably 40 g/10 minutes. The lower limit of the MFR is more preferably 5 g/10 minutes. The MFR is measured at a temperature of 190° C. and a load of 21.18 N by the method defined in JIS K7210-1995.

The molecular weight distribution (Mw/Mn) of the ethylene-unsaturated ester copolymer is preferably 2 to 8 from the viewpoint of enhancing processability. The lower limit of the molecular weight distribution is more preferably 2.5, even more preferably 3. The upper limit of the molecular weight distribution is more preferably 5, even more preferably 4.5, and still more preferably 4. Mw denotes a polystyrene-equivalent weight average molecular weight and Mn denotes a polystyrene-equivalent number average molecular weight.

The polyethylene-equivalent weight average molecular weight of the ethylene-unsaturated ester copolymer is preferably 40000 to 80000, more preferably 50000 to 70000. The polyethylene-equivalent weight average molecular weight is a product of a polystyrene-equivalent weight average molecular weight and a Q factor ratio of polyethylene to polystyrene (17.7/41.3), the polystyrene-equivalent weight average molecular weight having been determined by gel permeation chromatography measurement.

Examples of the method for producing the ethylene-unsaturated ester copolymer include slurry polymerization, solution polymerization, bulk polymerization and gas phase polymerization.

[At Least One Compound Selected from the Group Consisting of Silicon Dioxide and Zeolite]

The encapsulant sheet according to the present invention contains 0.001 parts by mass to 5 parts by mass of at least one compound selected from the group consisting of silicon dioxide and zeolite relative to 100 parts by mass of the ethylene-based resin. The encapsulant sheet may contain only silicon dioxide, may contain only zeolite, or may contain both silicon dioxide and zeolite, as the compound.

Silicon dioxide is a compound represented by a formula $SiO_2$ and includes crystalline silicon dioxide and amorphous silicon dioxide. Amorphous silicon dioxide includes calcined amorphous silicon dioxide and non-calcined amorphous silicon dioxide.

Examples of calcined amorphous silicon dioxide include calcined silica CARPLEX CS-5 produced by Evonik Degussa Japan Co., Ltd. Examples of non-calcined amorphous silicon, dioxide include VK-SP30S produced by Xuan Cheng Jing Rui New Material Co., Ltd., China, poroos silica produced by Suzuki Yushi Industrial Co., Ltd., Gasil AB905 produced by PQ Corporation, Snow Mark SP-5 produced by MARUKAMA CO., Ltd., silica CARPLEX #80, CARPLEX EPS-2, and CARPLEX FPS-101 produced by Evonik Degussa Japan Co., Ltd.

Amorphous silicon dioxide is preferred as silicon dioxide, and non-calcined amorphous silicon dioxide is more preferred.

Silicon dioxide preferably exhibits an ignition loss as large as possible and the ignition loss is preferably 1.3% or more, more preferably 1.5% or more, even more preferably 2% or more, still even more preferably 3% or more. The ignition loss of silicon dioxide is usually 15% or less, preferably 13% or less, more preferably 10% or less. The ignition loss is a value measured in accordance with the method defined in JIS K1150-1994 using a sample dried at about 150° C. under a vacuum.

Zeolite is a substance having a formula $M_2/nO \cdot Al_2O_3 \cdot xSiO_2 \cdot yH_2O$ (M denotes Na, K, Ca or Ba, n denotes a valency, x denotes a number of 2 to 10, and y denotes a number of 2 to 7) and having a structure in which an alkali metal, an alkaline earth metal or a water molecule is captured within a cavity located within a three-dimensional network structure formed by (Al, Si) $O_4$ tetrahedrons with their apexes shared. In the present invention, either natural zeolite or synthetic zeolite can be used. Examples of natural zeolite include analcite, chabazite, erionite, natrolite, mordenite, clinoptilolite, heulandite, stilbite and lomontite. Examples of synthetic zeolite include A-type zeolite, X-type zeolite, Y-type zeolite, L-type zeolite, and ZSM-5. Synthetic zeolite can be obtained by well mixing starting materials such as sodium silicate, sodium aluminate and silica gel to form crystals at 80 to 120° C., washing the crystals with water to pH9 to 12, and then filtering.

Examples of zeolite include high silica zeolites HSZ-series 820NHA, 822HOA, 643NHA, and 842HOA produced by Tosoh Corporation, and molecular sieve series 3A and 4A produced by Onion Showa K.K.

Zeolite preferably exhibits an ignition loss as large as possible and the ignition loss is preferably 1.3% or more, more preferably 1.5% or more, even more preferably 2% or more, still even more preferably 3% or more, further more preferably 4% or more. The ignition loss of zeolite is usually 15% or less, preferably 13% or less, more preferably 10% or less. The ignition loss is a value measured in accordance with the method defined in JIS K1150-1994 using a sample dried at about 150° C. under a vacuum.

The average particle diameter of the at least one compound selected from the group consisting of silicon dioxide and zeolite according to the present invention is preferably 0.001 μm to 30 μm, more preferably 0.01 μm to 10 μm from the viewpoint of enabling the compound to disperse more uniformly in the encapsulant sheet according to the present invention.

The average particle diameter of the compound is a median particle size of the particle size distribution measured by volume from a diffraction image formed on a focal plane by applying laser beams to a dispersion of the compound in ethanol and then collecting the scattered light with a lens.

Examples of the method for adjusting the average particle diameter of the compound to 0.001 μm to 30 μm include a method of crushing the compound with a mortar and a method of pulverising the compound with a jet mill.

The content of the at least one compound selected from the group consisting of silicon dioxide and zeolite contained in the encapsulant sheet of the present invention is 0.001 parts by mass to 5 parts by mass relative to 100 parts by mass of the ethylene-based resin. From the viewpoint of enhancing insulating properties and water vapor barrier properties, the lower limit of the content is preferably 0.01 parts by mass, more preferably 0.1 parts by mass, whereas the upper limit of the content is preferably 5 parts by mass, more preferably 0.5 parts by mass.

[Silane Coupling Agent]

The silane coupling agent according to the present invention is added for the purpose of enhancing the adhesion force of the encapsulant sheet to a light receiving surface protective material, a lower part protective material (a back sheet) and a solar cell element. Examples of the silane coupling agent include γ-chloropropyltrimethoxysilane, vinyltrichlorosilane, vinyltriethoxysilane, vinyl-tris(β-methoxyethoxy)silane, γ-methacryloxypropyltrimethoxysilane, β-(3,4-ethoxycyclohexyl)ethyl-trimethoxysilane, γ-glycidoxypropyltrimethoxysilane, vinyltriacetoxysilane, γ-mercaptopropyltrimethoxysilane, γ-aminopropyltrimethoxysilane, and N-β-(aminoethyl)-γ-aminopropyltrimethoxysilane.

The content of the silane coupling agent contained in the encapsulant sheet according to the present invention is 0.001 parts by mass to 5 parts by mass relative to 100 parts by weight of the ethylene-based resin. The lower limit of the content is preferably 0.01 parts by mass, more preferably 0.1 parts by mass, whereas the upper limit of the content is preferably 5 parts by mass, more preferably 1.0 parts by mass, even more preferably 0.5 parts by mass.

[Solar Cell Encapsulant Sheet]

The solar cell encapsulant sheet according to the present invention comprises at least one ethylene-based resin selected from the group consisting of an ethylene-α-olefin copolymer, an ethylene homopolymer and an ethylene-unsaturated ester copolymer, 0.001 parts by mass to 5 parts by mass of at least one compound selected from the group consisting of silicon dioxide and zeolite, and 0.001 parts by mass to 5 parts by mass of a silane coupling agent, relative to 100 parts by mass of the ethylene-based resin respectively.

As described in Examples given below, the solar cell encapsulant sheet of the present invention is higher in specific volume resistivity than solar cell encapsulant sheets not containing at least one compound selected from the group consisting of silicon dioxide and zeolite. Therefore, the solar cell encapsulant sheet of the present invention is used suitably for a solar cell encapsulant to be used for encapsulation and protection of solar cell elements such as a single crystal silicon solar cell element, a polycrystalline silicon solar cell element, an amorphous silicon solar cell element, and a compound solar cell element. Conventional solar cell modules may have been deteriorated in power generation performance due to defective insulation of an encapsulant sheet if used at high voltage. The solar cell encapsulant sheet of the present invention can be inhibited from deteriorating in power generation performance because of its excellent insulating property.

Examples of the method for producing the solar cell encapsulant sheet include a method in which an ethylene-based resin, at least one compound selected from the group consisting of silicon dioxide and zeolite, and a silane coupling agent are processed into a sheet by using a sheet processing machine, such as a flat die extruder and a calender.

Alternatively, an ethylene-based resin, at least one compound selected from the group consisting of silicon dioxide and zeolite, and a silane coupling agent may be melt-kneaded beforehand to prepare a resin composition, which is then fed to a sheet processing machine and processed into a sheet. Still alternatively, a resin pellet in which at least one compound selected from the group consisting of silicon dioxide and zeolite is attached to the surface of a pellet of an ethylene-based resin may be fed to a sheet processing machine together with a silane coupling agent.

The solar cell encapsulant sheet according to the present invention may, as necessary, contain a crosslinking agent, a crosslinking aid, a UV absorber, an antioxidant, an antifogging agent, a plasticizer, a surfactant, a coloring agent, an antistatic agent, an anti-discoloring agent, a flame retardant, a nucleating agent, a lubricant, or the like.

Any substance that generates a radical at temperatures higher than the melting point of the ethylene-based resin according to the present invention can be used as the crosslinking agent, and an organic peroxide whose one-hour half-life temperature is higher than the melting point of the ethylene-based resin contained in the encapsulant sheet is preferred. In order to make a crosslinking agent less prone to decompose during sheet processing, to allow the crosslinking agent to be decomposed by heating at the time of the fabricating of the solar cell module described below, and to allow crosslinking between the ethylene-based resins contained in the encapsulant sheet to proceed easily, an organic peroxide whose one-hour half-life temperature is 100° C. to 135° C. is preferred as the crosslinking agent. An organic peroxide whose one-hour half-life temperature is 70° C. or higher is preferred in terms of resistance of a crosslinking agent to proceeding of decomposition during sheet processing, and for example, tert-butylperoxy-2-ethylhexyl carbonate, 2,5-dimethylhexane-2,5-dihydro peroxide, 2,5-dimethyl-2,5-di(tert-butylperoxy) hexane-3, di-tert-butyl peroxide, tert-dicumyl peroxide, 2,5-dimethyl-2,5-di(tert-butylperoxy) hexane, dicumyl peroxide, α,α'-bis(tert-butylperoxyisopropyl)benzene, n-butyl-4,4-bis(tert-butylperoxy)butane, 2,2-bis(tert-butylperoxy)butane, 1,1-bis(tert-butylperoxy)cyclohexane, 1,1-bis(tert-butylperoxy)-3,3,5-trimethylcyclohexane, tert-butyl peroxybenzoate, and benzoyl peroxide can be used. Preferably, the content of the crosslinking agent contained in the encapsulant sheet according to the present invention is, for example, 0.001 parts by mass to 5 parts by mass relative to 100 parts by mass of the ethylene-based resin.

When a solar cell encapsulant sheet contains a crosslinking agent, the crosslinking agent that has remained undecomposed by the heating during the fabrication of a solar cell module may cause deterioration, such as discoloration, of the encapsulant sheet through its gradual decomposition during the use of the solar cell module. In order to prevent degradation of an encapsulant sheet caused by such a remaining crosslinking agent, a smaller content of the crosslinking agent contained in the encapsulant sheet is preferred. From the viewpoint that the encapsulant sheet according to the present invention can be allowed even in a small content of the crosslinking agent to have a crosslinked structure with a high gel fraction, the encapsulant sheet preferably contains the crosslinking aid described below as well as the above-mentioned crosslinking agent. Examples of the crosslinking aid include monofunctional crosslinking aids, bifunctional crosslinking aids, trifunctional crosslinking aids, and hexafunctional crosslinking aids. Examples of the monofunctional crosslinking aid include acrylates and methacrylates. Examples of the bifunctional crosslinking aid include N,N'-m-phenylenebismaleimide. Examples of the trifunctional crosslinking aid include triallyl isocyanurate and trimethylolpropane triacrylate. Examples of the hexafunctional crosslinking aid include dipentaerythritol hexaacrylate. Preferably, the content of the crosslinking aid contained in the encapsulant sheet according to the present invention is, for example, 10 parts by mass or less relative to 100 parts by mass of the ethylene-based resin.

Examples of the UV absorber include benzophenone UV absorbers, benzotriazole UV absorbers, and hindered amine UV absorbers. Examples of the benzophenone UV absorbers include 2-hydroxy-4-octoxybenzophenone and 2-hydroxy-4-methoxy-5-sulfobenzophenone. Examples of the benzotriazole UV absorbers include 2-(2'-hydroxy-5-methylphenyl)benzotriazole. Examples of the hindered amine UV absorbers include phenyl salicylate and p-tert-butylphenyl salicylate.

Examples of the antioxidant include amine antioxidants, phenol antioxidants, bisphenyl antioxidants, and hindered amine antioxidants, and specific examples include di-tert-butyl-p-cresol and bis(2,2,6,6-tetramethyl-4-piperadyl) sebacate.

[Solar Cell Module]

A solar cell module in which a solar cell element is encapsulated between a light receiving surface protective material and a lower part protective material can be obtained using the solar cell encapsulant sheet of the present invention. Examples of the light receiving surface protective material in a solar cell include translucent members made of glass, plastics, or the like. Examples of the lower protective material include various protective materials made of plastics, ceramics, stainless steel, aluminum, or the like.

A solar cell module is fabricated, for example, in the following way. On each side of a planar solar cell element such as a solar cell silicon substrate is disposed one solar cell encapsulant sheet of the present invention. The solar cell element on which the solar cell element encapsulant sheets have been disposed is placed in a vacuum laminator with one side thereof being in contact with the above-mentioned light receiving surface protective material and the other side thereof being in contact with the above-mentioned lower part protective material and then the inside of the vacuum laminator is provided in a vacuum state, followed by heating to a temperature at which the solar cell encapsulant sheet melts. After allowing the solar cell encapsulant sheet to melt to some extent, pressure is applied while heating. The heating under vacuum and under the application of pressure causes polymers contained in each of the solar cell encapsulant sheets to crosslink together and moreover causes the polymers contained in the solar cell encapsulant sheet disposed on one side of the solar cell element to crosslink with the polymers contained in the solar cell encapsulant sheet disposed on the other side. Furthermore, the heating causes the silane coupling agent contained in the solar cell encapsulant sheet to react with the above-mentioned light receiving surface protective material, causes the silane coupling agent contained in the solar cell encapsulant sheet to react with the above-mentioned lower part protective material, and causes the silane coupling agent contained in the solar cell encapsulant sheet to react with the solar cell element, so that the solar cell encapsulant sheet is adhered to the light receiving surface protective material, the solar cell encapsulant sheet is adhered to the lower part protective material, and the solar cell encapsulant sheets are adhered to the solar cell element.

Examples of the solar cell element include monocrystalline silicon, polycrystalline silicon, amorphous silicon, and compound-based elements.

EXAMPLES

The present invention is described in more detail below by Examples.

[Specific Volume Resistivity (Unit: Ω·Cm)]

A sheet was mounted to a large-diameter electrode for a planar sample (SME-8310 produced by DKK-TOA Corporation) and a voltage of 500 V was applied thereto. The resistivity after one minute was measured with a digital insulation analyzer (DSM-8103 manufactured by DKK-TOA Corporation). Based on the measured value, a specific volume resistivity was calculated.

[Water Vapor Permeability]

Water vapor permeability ($g/m^2 \cdot 24$ hours) of a sheet was measured in accordance with the humidity sensor method defined in the Appendix A of JIS K7129-2008. Smaller water vapor permeabilities are preferred.

[Average Particle Diameter (Unit: μm)]

The average particle diameters of zeolite and silicon dioxide were calculated by the following method.

Zeolite or silicon dioxide was added to ethanol and then dispersed for 10 minutes with a homogenizer. The dispersion was irradiated with a laser beam, and then a diffraction image formed on a focal plane by collecting the scattered light with a lens was measured as a particle size distribution by volume with a Microtrac particle size distribution analyzer (MT-300EX II manufactured by Nikkiso Co., Ltd.). Thus, a median particle diameter of the particle size distribution was determined.

[Melt Flow Rate (MFR; Unit: g/10 Minutes)]

The MFR of a resin was measured at a temperature of 190° C. and a load of 21.18 N by the method defined in JIS K7210-1995.

[Ignition Loss (Unit: %)]

The ignition loss of zeolite and silicon dioxide was measured in accordance with the method defined in JIS K1150-1994 using a sample dried under vacuum at about 150° C. for 2 hours.

Example 1

A sheet with a thickness of about 500 µm was prepared by kneading 100 parts by mass of an ethylene-vinyl acetate copolymer (EVA-1, produced by Sumitomo Chemical Co., Ltd., KA-40, MFR: 20 g/10 minutes, the amount of monomer units derived from vinyl acetate: 28% by mass), 0.2 parts by mass of zeolite (Zeolite 820NHA, produced by Tosoh Corporation, the average particle diameter: 5 µm, the ignition loss: 4.2%), 0.12 parts by mass of γ-methacryloxypropyltrimethoxysilane (Silquest A-174, produced by Momentive Performance Materials Japan LLC, silane coupling agent), 0.4 parts by mass or tert-butyl peroxy-2-ethylhexyl carbonate (PERBUTYL E, produced by NOF Corporation, the one-hour half-life temperature: 121° C., crosslinking agent), 0.9 parts by mass of triallyl isocyanurate (TAIC, produced by Tokyo Chemical Industry Co., Ltd., crosslinking aid), 0.3 parts by mass of 2-hydroxy-4-n-octoxybenzophenone (Sumisorb130, produced by Sumika Chemtex Co., Ltd, the average particle diameter: 178 µm), and 0.08 parts by mass of bis(2,2,6,6,-tetramethyl-4-piperidyl) sebacate (Tinuvin 770 DF, produced by BASF A.G.) for 5 minutes with a Labo Plastomill, subsequently pressing with a hot presser at 100° C. for 5 minutes with a pressure of 2 MPa, and subsequently cooling for 5 minutes with a cooling presser at 30° C. The specific volume resistivity and the water vapor permeability of the resulting sheet were measured and the results are shown in Table 1.

Example 2

A sheet was prepared and evaluated in the same manner as in Example 1 except that 0.2 parts by mass of silicon dioxide (non-calcined amorphous silicon dioxide, Gasil AB905, produced by PQ Corporation, the average particle diameter; 6 µm, the ignition loss: 3.1%) was used instead of 0.2 parts by mass of the zeolite of Example 1. The results of evaluation are shown in Table 1.

Example 3

A sheet was prepared and evaluated in the same manner as in Example 1 except that 0.1 parts by mass of silicon dioxide (non-calcined amorphous silicon dioxide, CARPLEX FPS-2, produced by Evonik Degussa Japan Co., Ltd., the average particle diameter: 2 µm, the ignition loss: 3.7%) was used instead of 0.2 parts by mass of the zeolite of Example 1. The results of evaluation are shown in Table 1.

Example 4

A sheet was prepared and evaluated in the same manner as in Example 1 except that 0.1 parts by mass of silicon dioxide (calcined amorphous silicon dioxide, CARPLEX CS-5, produced by Evonik Degussa Japan Co., Ltd., the average particle diameter: 8 µm, the ignition loss: 1.7%) was used instead of 0.2 parts by mass of the zeolite of Example 1. The results of evaluation are shown in Table 1.

Example 5

A sheet was prepared and evaluated in the same manner as in Example 1 except that 100 parts by mass of ethylene-methyl methacrylate (EMMA-1, produced by Sumitomo Chemical Co., Ltd., WK402, MFR: 20 g/10 minutes, the amount of monomer units derived from methyl methacrylate: 25% by mass) was used instead of the ethylene-vinyl acetate copolymer (EVA-1) of Example 3. The results of evaluation are shown in Table 3.

Example 6

A calcined zeolite was obtained by calcining zeolite 820NHA (Zeolite 820NHA, produced by Tosoh Corporation, the average particle diameter: 5 µm) at about 600° C. for about 1 hour. The calcined zeolite exhibited an ignition loss of 1.0%.

A sheet was prepared and evaluated in the same manner as in Example 1 except that 0.1 parts by mass of the calcined zeolite was used instead of 0.2 parts by mass of the zeolite of Example 1. The results of evaluation are shown in Table 4.

Example 7

A sheet was prepared and evaluated in the same manner as in Example 1 except that 0.1 parts by mass of zeolite (synthetic zeolite A-4, produced by Wako Pure Chemical Industries, Ltd., the average particle diameter: 5 µm, the ignition loss: 10%) was used instead of 0.2 parts by mass of the zeolite of Example 1. The results of evaluation are shown in Table 4.

Example 8

A sheet was prepared and evaluated in the same manner as in Example 1 except that 0.1 parts by mass of silicon dioxide (uncalcined silicon dioxide silica microcapsule KA, produced by Japan Insulation Co., Ltd., the average particle diameter: 5 µm, the ignition loss: 7.9%) was used instead of 0.2 parts by mass of the zeolite of Example 1. The results of evaluation are shown in Table 4.

Example 9

A calcined amorphous silicon dioxide was obtained by calcining CARPLEX CS-5 (calcined amorphous silicon dioxide, produced by Evonik Degussa Japan Co., Ltd., the average particle diameter: 8 µm at about 600° C. for about 1 hour. The calcined amorphous silicon dioxide exhibited an ignition loss of 1.1%.

A sheet was prepared and evaluated in the same manner as in Example 1 except that 0.1 parts by mass of the calcined amorphous silicon dioxide was used instead of 0.2 parts by mass of the zeolite of Example 1. The results of evaluation are shown in Table 4.

Example 10

A sheet was prepared and evaluated in the same manner as in Example 1 except that 0.2 parts by mass of silicon dioxide (calcined amorphous silicon dioxide, CARPLEX CS-5, produced by Evonik Degussa Japan Co., Ltd., the average particle diameter: 8 μm, the ignition loss: 1.7%) was used instead of 0.2 parts by mass of the zeolite of Example 1 and 0.12 parts by mass of the γ-methacryloxypropyltrimethoxysilane of Example 1 was varied to 0.25 parts by mass thereof. The results of evaluation are shown in Table 4.

Comparative Example 1

A sheet was prepared and evaluated in the same manner as in Example 1 except that no zeolite was used. The results of evaluation are shown in Table 2.

Comparative Example 2

A sheet was prepared and evaluated in the same manner as in Example 1 except that 0.1 parts by mass of hydrotalcite (Hydrotalcite DHT-4A, produced by Kyowa Chemical Industry Co., Ltd., the average particle diameter: 0.4 μm) was used instead of 0.2 parts by mass of the zeolite of Example 1. The results of evaluation are shown in Table 2.

Comparative Example 3

A sheet was prepared and evaluated in the same manner as in Example 1 except that 0.1 parts by mass of talc (Talc JR37, produced by NIPPON TALC Co., Ltd., the average particle diameter: 3 μm) was used instead of 0.2 parts by mass of the zeolite of Example 1. The results of evaluation are shown in Table 2.

Comparative Example 4

A sheet was prepared and evaluated in the same manner as in Comparative Example 3 except that the amount of talc of Comparative Example 3 was varied to 15 parts by mass. The results of evaluation are shown in Table 2.

Comparative Example 5

A sheet was prepared and evaluated in the same manner as in Example 3 except that the amount of silicon dioxide of Example 3 was varied to 15 parts by mass. The results of evaluation are shown in Table 2.

Comparative Example 6

A sheet was prepared and evaluated in the same manner as in Example 5 except that no silicon dioxide was used. The results of evaluation are shown in Table 3.

TABLE 1

|  |  | Example 1 | Example 2 | Example 3 | Example 4 |
|---|---|---|---|---|---|
| Resin pellet |  | EVA-1 | EVA-1 | EVA-1 | EVA-1 |
| Compound |  | Zeolite 820NHA | Silicon dioxide Gasil AB905 | Silicon dioxide CARPLEX FPS-2 | Silicon dioxide CARPLEX CS-5 |
| Content of compound | part by mass | 0.2 | 0.2 | 0.1 | 0.1 |
| Content of silane coupling agent | part by mass | 0.12 | 0.12 | 0.12 | 0.12 |
| Specific volume resistivity | Ω · cm | $8.5 \times 10^{14}$ | $2.2 \times 10^{15}$ | $2.6 \times 10^{15}$ | $1.8 \times 10^{15}$ |
| Water vapor permeability | g/(m² · 24 hours) | 35 | 34 | 35 | 35 |

TABLE 2

|  |  | Comparative Example 1 | Comparative Example 2 | Comparative Example 3 | Comparative Example 4 | Comparative Example 5 |
|---|---|---|---|---|---|---|
| Resin pellet |  | EVA-1 | EVA-1 | EVA-1 | EVA-1 | EVA-1 |
| Compound |  | None | Hydrotalcite | Talc | Talc | Silicon dioxide CARPLEX FPS-2 |
| Content of compound | part by mass | — | 0.1 | 0.1 | 15 | 15 |
| Content of silane coupling agent | part by mass | 0.12 | 0.12 | 0.12 | 0.12 | 0.12 |
| Specific volume resistivity | Ω · cm | $9.2 \times 10^{13}$ | $6.5 \times 10^{11}$ | $2.2 \times 10^{14}$ | $2.9 \times 10^{13}$ | $7.0 \times 10^{13}$ |
| Water vapor permeability | g/(m² · 24 hours) | 38 | 36 | 38 | 34 | 35 |

TABLE 3

|  |  | Example 5 | Comparative Example 6 |
|---|---|---|---|
| Resin pellet |  | EMMA-1 | EMMA-1 |
| Compound |  | Silicon dioxide CARPLEX FPS-2 | None |
| Content of compound | part by mass | 0.1 | — |
| Content of silane coupling agent | part by mass | 0.12 | 0.12 |
| Specific volume resistivity | Ω · cm | $8.0 \times 10^{14}$ | $4.0 \times 10^{14}$ |
| Water vapor permeability | g/(m² · 24 hours) | 14 | 17 |

TABLE 4

|  |  | Example 6 | Example 7 | Example 8 | Example 9 | Example 10 |
|---|---|---|---|---|---|---|
| Resin pellet |  | EVA-1 | EVA-1 | EVA-1 | EVA-1 | EVA-1 |
| Compound |  | Zeolite 820NHA Calcined | Zeolite Synthetic zeolite A-4 | Silicon dioxide Silica microcapsale KA | Silicon dioxide CARPLEX CS-5 Calcined | Silicon dioxide CARPLEX CS-5 |
| Content of compound | part by mass | 0.1 | 0.1 | 0.1 | 0.1 | 0.2 |
| Content of silane coupling agent | part by mass | 0.12 | 0.12 | 0.12 | 0.12 | 0.25 |
| Specific volume resistivity | $\Omega \cdot cm$ | $5.1 \times 10^{14}$ | $2.1 \times 10^{15}$ | $2.4 \times 10^{15}$ | $5.2 \times 10^{14}$ | $2.4 \times 10^{15}$ |
| Water vapor permeability | $g/(m^2 \cdot 24\ hours)$ | 37 | 37 | 36 | 37 | 35 |

What is claimed is:

1. A solar cell encapsulant sheet comprising at least one ethylene-based resin selected from the group consisting of an ethylene-α-olefin copolymer, an ethylene homopolymer and an ethylene-unsaturated ester copolymer, 0.001 parts by mass to 5 parts by mass of at least one compound selected from the group consisting of silicon dioxide and zeolite, and 0.001 parts by mass to 5 parts by mass of a silane coupling agent, relative to 100 parts by mass of the ethylene-based resin respectively, wherein the ignition loss of the compound is 1.3% to 15%.

2. The solar cell encapsulant sheet according to claim 1, wherein the ignition loss of the compound is 1.3% to 10%.

3. The solar cell encapsulant sheet according to claim 1, wherein the content of the silane coupling agent is 0.01 parts by mass to 0.5 parts by mass.

4. The solar cell encapsulant sheet according to claim 1, wherein the ethylene-based resin is an ethylene-unsaturated ester copolymer.

5. The solar cell encapsulant sheet according to claim 4, wherein the ethylene-unsaturated ester copolymer is at least one copolymer selected from the group consisting of an ethylene-vinyl acetate copolymer, an ethylene-methyl acrylate copolymer, an ethylene-methyl methacrylate copolymer and an ethylene-vinyl acetate-methyl methacrylate copolymer.

6. A solar cell module in which a solar cell element is encapsulated between a light receiving surface protective material and a lower part protective material using the sheet according to claim 1.

* * * * *